(12) United States Patent
Freytag

(10) Patent No.: US 7,282,918 B2
(45) Date of Patent: Oct. 16, 2007

(54) NUCLEAR MAGNETIC RESONANCE APPARATUS WITH A GRADIENT SHIELDING CONFIGURATION HAVING REDUCED COUPLING TO THE RESONATOR SYSTEM

(75) Inventor: Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/485,265

(22) Filed: Jul. 13, 2006

(65) Prior Publication Data

US 2007/0018647 A1    Jan. 25, 2007

(30) Foreign Application Priority Data

Jul. 21, 2005    (DE)    ...... 10 2005 033 989

(51) Int. Cl.
*G01V 3/00*    (2006.01)
(52) U.S. Cl. ...... 324/318; 324/319
(58) Field of Classification Search ........ 324/300–322; 600/410–445
See application file for complete search history.

(56) References Cited

U.S. PATENT DOCUMENTS

| | | | |
|---|---|---|---|
| 4,310,799 A | 1/1982 | Hutchison |
| 4,506,224 A | 3/1985 | Krause |
| 4,642,569 A | 2/1987 | Hayes |
| 4,871,969 A | 10/1989 | Roemer |
| 4,879,515 A | 11/1989 | Roemer |
| 5,243,286 A | 9/1993 | Rzedzian |
| 5,367,261 A | 11/1994 | Perry |
| 5,381,093 A | 1/1995 | Kawamoto |
| 5,396,173 A | 3/1995 | Sakakura |
| 5,572,129 A | 11/1996 | Carison |

(Continued)

FOREIGN PATENT DOCUMENTS

DE    198 43 905    4/2000

(Continued)

*Primary Examiner*—Brij Shrivastav
(74) *Attorney, Agent, or Firm*—Paul Vincent

(57) ABSTRACT

A nuclear magnetic resonance apparatus for generating a homogeneous static magnetic field in the z-direction, comprising a coil/resonator system, a gradient system, and a shielding configuration which is positioned radially between the coil/resonator system and the gradient system, wherein the shielding configuration comprises an electrically conducting layer with a slot, wherein the electrically conducting layer is disposed about the center of the shielding configuration to be axially symmetrical with respect to the z-axis, is characterized in that, in an axial section $z1<z<z2$ with $z2-z1>L$, containing at least 90% of the magnetic field energy of the coil/resonator system, the shielding configuration comprises at least one pair of regions which have a cylinder envelope shape, wherein the regions of each pair are each defined by two respectively closed limiting lines circulating about the z-axis, and wherein the two limiting lines of each region have a mutual axial separation $$a \leq \frac{z2-z1}{2}$$

from each other and are disposed on planes parallel to the xy plane, wherein the regions are geometrically positioned in such a manner that they have opposite inductive couplings for part of the eigenmodes of the shielding configuration. In this manner, coupling of energy from the resonator/coil system into the shielding configuration is prevented or minimized.

19 Claims, 11 Drawing Sheets

U.S. PATENT DOCUMENTS

| | | | |
|---|---|---|---|
| 5,574,372 A | 11/1996 | Moritz | |
| 5,680,046 A | 10/1997 | Frederick | |
| 6,177,797 B1 * | 1/2001 | Srinivasan | 324/318 |
| 6,420,871 B1 | 7/2002 | Wong | |
| 6,873,153 B2 * | 3/2005 | Frydman | 324/307 |
| 6,965,233 B2 * | 11/2005 | Le Roux | 324/309 |
| 7,180,291 B2 * | 2/2007 | Chmielewski et al. | 324/318 |
| 2004/0189304 A1 | 9/2004 | Anderson | |

FOREIGN PATENT DOCUMENTS

| | | |
|---|---|---|
| GB | 2 338 788 | 12/1999 |
| JP | 05 082333 | 4/1993 |
| WO | WO 01/78089 | 10/2001 |
| WO | WO 03/008988 | 1/2003 |

* cited by examiner $\nu_{NMR}$/MHz; B=18.79T $\nu_{NMR}$/MHz; B=18.79T $\nu_{NMR}$/MHz; B=11.74, 14.09, 16.44, 18.79T

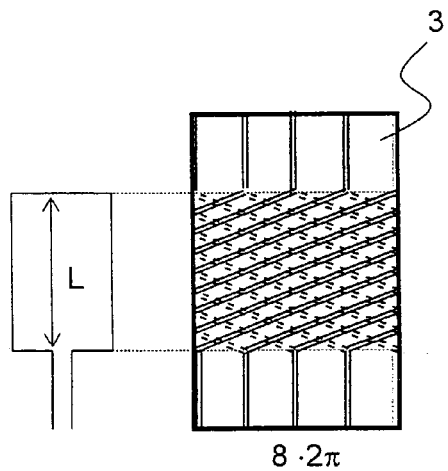
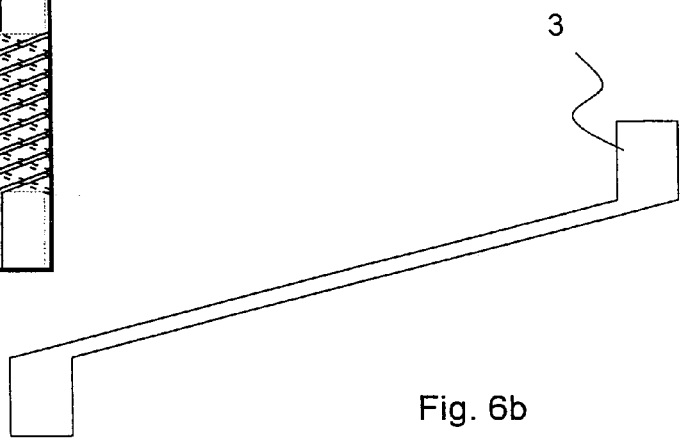
Fig. 6a  Fig. 6b
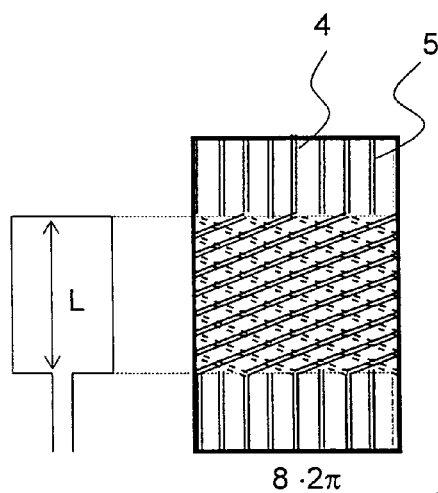
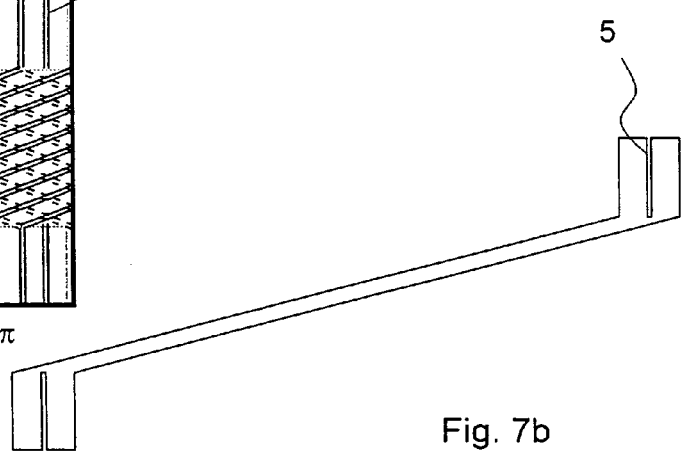
Fig. 7a  Fig. 7b

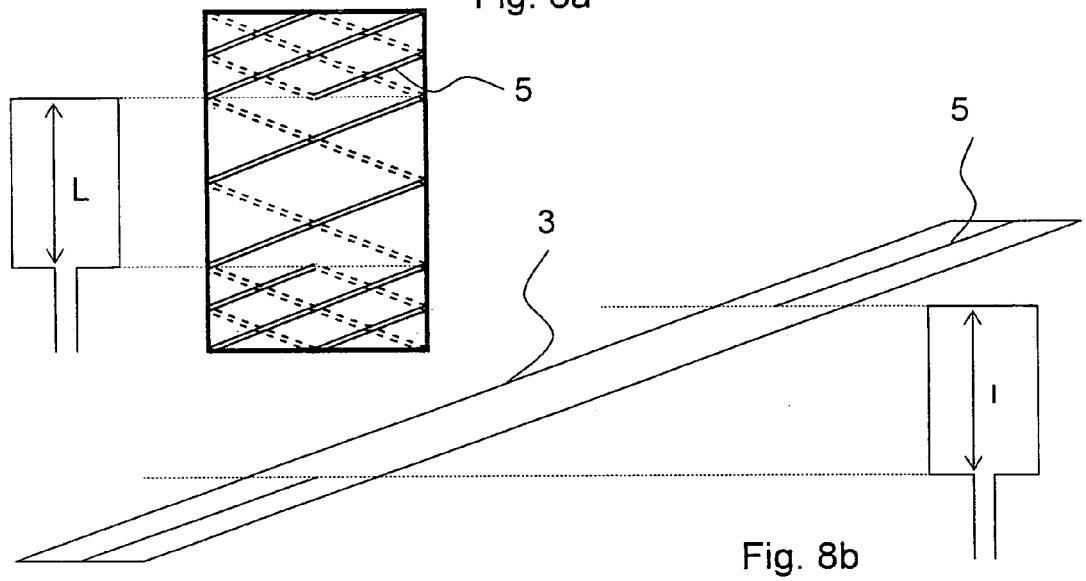
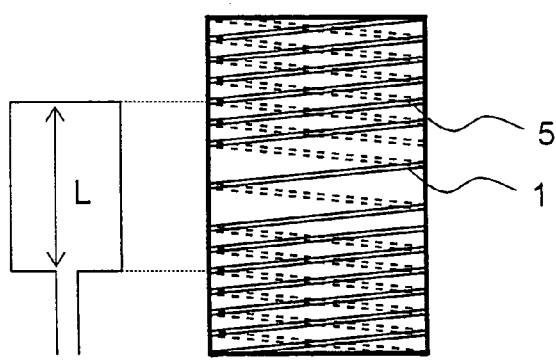

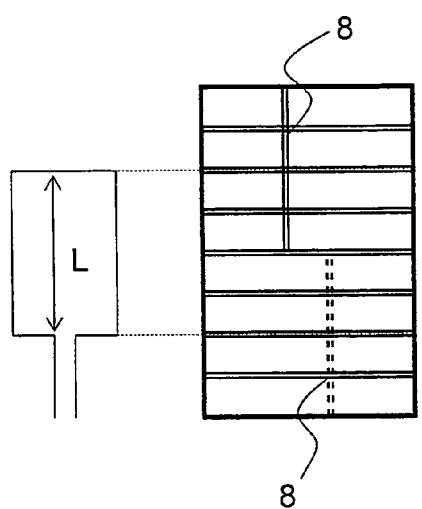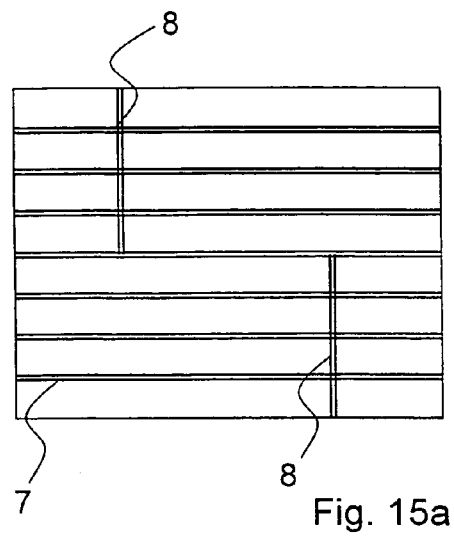
Fig. 15a
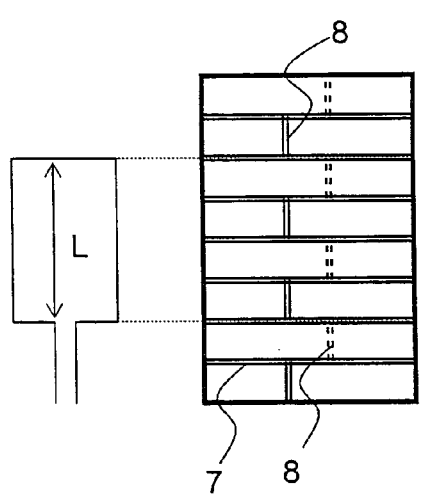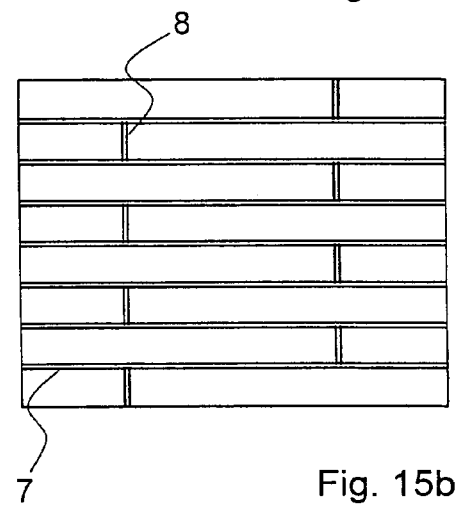
Fig. 15b
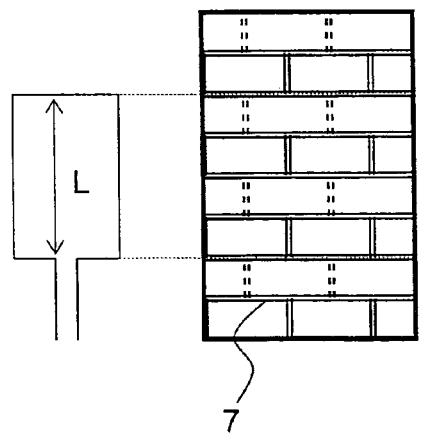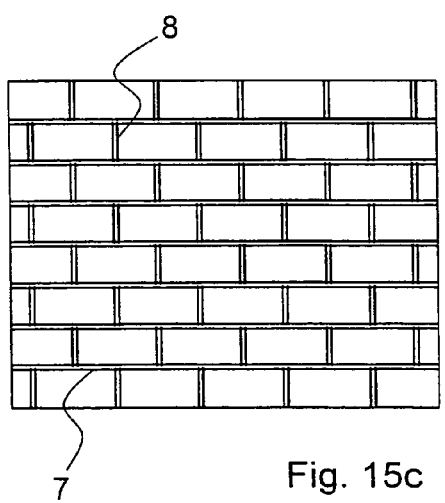
Fig. 15c

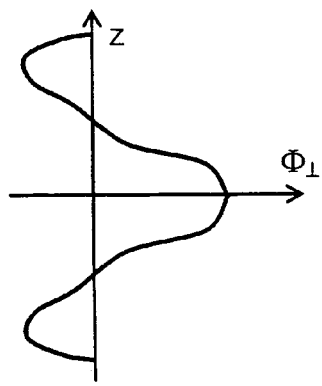
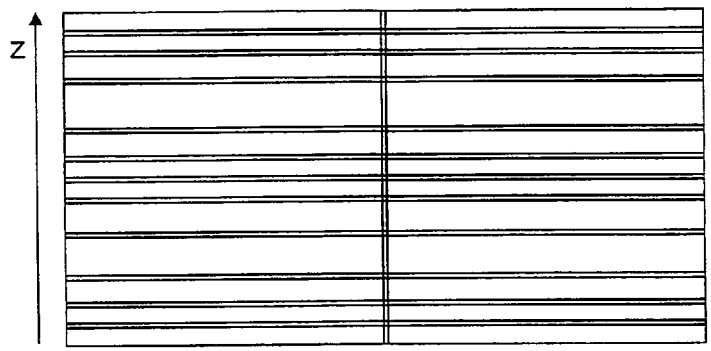
Fig. 20a				Fig. 20b
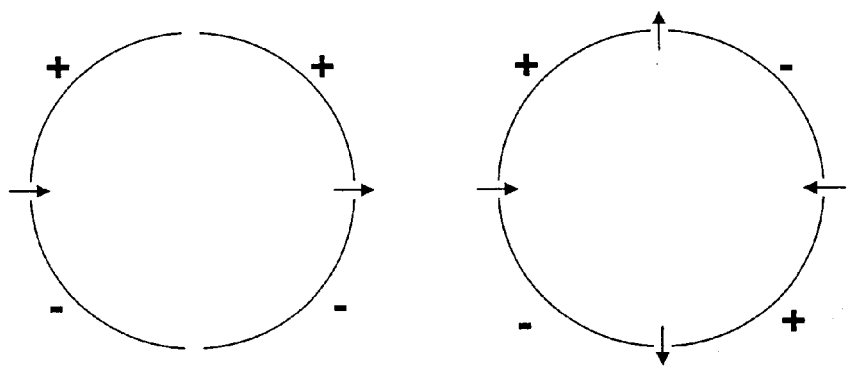
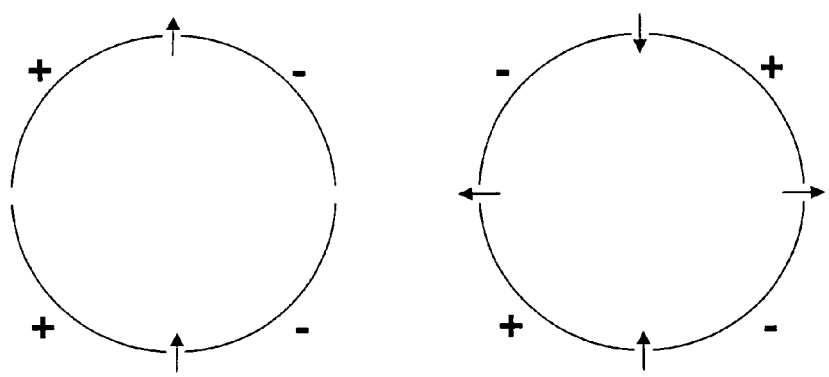
Fig. 21

NUCLEAR MAGNETIC RESONANCE APPARATUS WITH A GRADIENT SHIELDING CONFIGURATION HAVING REDUCED COUPLING TO THE RESONATOR SYSTEM

This application claims Paris Convention priority of DE 10 2005 033 989.1 filed Jul. 21, 2005 the complete disclosure of which is hereby incorporated by reference.

BACKGROUND OF THE INVENTION

The invention concerns a nuclear magnetic resonance apparatus for generating a homogeneous, static magnetic field in the z-direction, comprising at least one coil/resonator system for transmitting and/or receiving radio frequency (RF) signals at at least one measuring frequency, a gradient system for generating pulsed field gradients in at least one spatial direction, and a shielding configuration which is positioned radially between the at least one coil/resonator system and the gradient system, wherein the shielding configuration comprises at least one electrically conducting layer with at least one continuous slot, wherein the electrically conducting layer is disposed about the center of the shielding configuration axially symmetrically with respect to the z-axis.

A nuclear magnetic resonance apparatus of this type is disclosed e.g. in [9].

A gradient shielding configuration should be impenetrable for the radio-frequency fields of the coil/resonator system, but should not perturb switching of the (DC) gradient pulses, which are within a frequency range of an order of magnitude of $\leq 10$ kHz.

In order to achieve this, conventional shielding configurations have slots, which interrupt the current paths the eddy currents induced during switching of the gradients "want" to take. At the same time, the mirror currents, which permit shielding of the RF fields, must still be allowed to flow. This is obtained through bridging the slots with capacitive elements which appear permeable to RF currents but which block the quasi DC currents during switching of the gradients.

There are currently two solutions for configuration of the slots:

In the conventional devices of [4],[5,],[7],[10], an electrically conducting, metallic layer is structured by annular conductor elements in such a manner that the mirror currents of the RF current are "imitated". Each of these annular conductor elements is additionally cut again to stop the eddy currents from the gradients. In order to create the RF path, a second layer is separately disposed using a dielectric to produce a capacitive connection for the RF shielding currents. Alternatively, a discrete capacitor is disposed across the slots, which closes the path for the RF currents.

Another approach suggests n-fold division in an axial direction, wherein overlaps and/or installation of discrete capacitive elements provide sufficient capacitive couplings between the stripe-shaped sections [1]-[3],[6],[8],[9]. Additional slots may be provided in the radial direction. In some embodiments, not all slots completely intersect the conducting layer in the z-direction.

Positioning of the slots, in particular, in the region of the coil/resonator system is generally influenced by the RF conditions. On the other hand, additional slots may be provided at certain locations to further attenuate the remaining eddy currents.

There are two simplified models to illustrate the effect of the slots.

The first model assumes that, despite the slots, the eddy currents try to continue to flow like in a shielding configuration without slots (FIG. 19a). FIG. 19b shows that in the slotted shielding configuration (shown in a developed view) additional currents only flow along the perpendicular slots. This increases the resistance for the shielding currents, thereby reducing the decay times. The larger the amount of slots introduced, the faster the decay of the eddy currents. FIG. 19c also shows that a radial slot in the center is helpful, in particular, for a z gradient, since it separates the regions with left-turning currents from those with right-turning currents.

A second model is based on the assumption that the flux remains undisturbed and the currents in the individual sections are distributed in accordance with the fluxes flowing through them. It is thereby assumed that a current is finally interrupted when it has been stopped by a slot (i.e. only one single axial slot is required and the rest are radial slots, as is shown for a z gradient in FIG. 20b).

In contrast to the first model (FIG. 19b), wherein the region of the highest currents (and at the same time lowest perpendicular flux) requires the greatest amount of slots, the second model (FIG. 20b) requires the finest division in the end region (outside of the reversal points of the gradient) and in the center, since the major part of the flux must "diffuse through the slots" at this location. FIG. 20a shows the perpendicular magnetic flux in dependence on the axial coordinate z.

In fact, both models do not adequately describe the real situation. They merely represent the two limiting viewpoints (undisturbed current in the first case and undisturbed flux in the second case). In order to obtain more precise information about the ideal position of the slots, a simulation calculation is required which can show the temporal decay of the gradient fields after switching off for a concrete case. The slots can then be positioned in an iterative manner. One problem thereby is, however, that the couplings to the resonator systems, possibly shim coils, tubes, elements of the resonator system etc. must also be taken into consideration.

The shielding effect of the shielding configuration relative to the RF fields in both above-mentioned conventional embodiments is based on the fact that the first eigenresonance of the RF shielding configuration is below the resonance frequency of the NMR coil. If this were not the case, the capacitive coupling would be insufficient to shield the RF fields.

The thickness of the electrically conducting layer is selected in each case to minimize the RF loss, and at the same time maximize the DC resistance. Layer thicknesses of approximately 3 skin depths (for NMR frequency) are currently used.

In particular, in the shielding configurations disclosed in [1]-[3],[6],[8],[9], which basically represent a radial configuration of metal strips, a plurality of eigenresonances are produced on the shielding configuration which can cause problems. In principle, such a configuration has as many modes as strips. FIG. 21 shows this by way of example for a configuration with four strips. An additional spectrum of higher harmonics is obtained when the wavelength decreases compared to the dimensions. The higher the number of elements used in such a shielding configuration, the more resonances it contains. In order to realize a maximum transparency for the gradient fields, the subdivision must be very fine (e.g. n=8, 16, 32). In this case, the spectrum becomes so dense that only very few frequency bands remain for the measuring frequencies.

Such gradient shieldings are generally used in MRI, which comprises one or maximally two measuring frequencies, with both frequencies being generally considerably below 200 MHz. In this case, the shielding configuration can be designed through selection of the capacitances between the strips, such that none of the maximally two measuring frequencies collides with the eigenmodes of the shielding configuration. If this were the case, the shielding effect would be considerably reduced and the Q-value and/or efficiency of the resonator system would be deteriorated.

For NMR systems, the situation is different. There are generally at least four measuring frequencies, possibly even a very wide band of frequencies that must all be tunable. It is basically impossible to design shielding configurations consisting of several elements in such a manner that none of the measuring frequencies comes close to a eigenresonance of the shielding configuration, while at the same time ensuring sufficient shielding effect for all modes.

The documents [11] and [12] disclose a coil type which geometrically cancels the coupling between two coils through geometric arrangement of the conductors being rotated by n*2π with respect to the window of a further coil. In this case, the integral of the magnetic flux of one coil that interacts with the other coil is zero.

The purpose of the invention is to propose a nuclear magnetic resonance apparatus with a shielding configuration that is designed in such a manner that only little or no energy is coupled from the resonator/coil system into the shielding configuration.

SUMMARY OF THE INVENTION

This object is achieved in accordance with the invention in that, in an axial section $z1<z<z2$ with $z2-z1>L$, wherein L=window length of the coil/resonator system containing at least 90% of the magnetic field energy of the coil/resonator system, the shielding configuration comprises at least one pair of regions around the z-axis, which have a cylinder envelope shape, wherein the two regions of each pair are each defined by two respectively closed limiting lines circulating about the z-axis, wherein the two limiting lines of each region have a mutual axial separation $$a \le \frac{z2-z1}{2}$$

from each other and are disposed on planes parallel to the xy plane, wherein the two regions of such a pair are geometrically positioned in such a manner that they have opposite inductive couplings to at least one coil/resonator system for at least part of the eigenmodes of the shielding configuration.

This geometric configuration of the elements of the shielding configuration yields a negligible inductive coupling between the resonator system and a certain number of eigenmodes of the shielding configuration. Under these conditions, the resonator system can be operated with small additional loss even when an eigenresonance of the shielding configuration is in the vicinity or even exactly at a measuring frequency. The "decoupling" between the two systems is obtained merely geometrically in the inventive apparatus through pairwise regions with opposite coupling (and, if possible, the same coupling strength) along the z-axis, such that the coupling of regions is at least largely eliminated for each pair.

In an advantageous embodiment, at least one slot of the electrically conducting layer of the shielding configuration completely interrupts the at least one electrically conducting layer in a direction having a z component other than zero, thereby exercising at least one complete rotation about the z-axis within the window length of the at least one coil/resonator system. The slot may be capacitively closed such that the lowest eigenresonance of the shielding configuration is below the resonance frequency of the NMR nuclei.

In a special embodiment of the inventive nuclear magnetic resonance apparatus, the slope of at least one slot of the electrically conducting layer of the shielding configuration extends uniformly over the entire section $z1<z<z2$ of the shielding configuration.

At least one slot of the electrically conducting layer of the shielding configuration preferentially comprises an integer multiple of revolutions about the z-axis along the window length of one or all RF coil/resonator systems. In this case, the coupling of the RF coil/resonator systems can be neglected.

In a particularly preferred embodiment of the invention, in addition to the at least one slot which completely intersects the electrically conducting layer of the shielding configuration, at least one further slot is provided which does not completely intersect the electrically conducting layer, starting from an end edge of the shielding configuration. This may be useful e.g. when the amplitude of the eddy currents is higher in some regions than in others during gradient switching.

This occurs mainly in the region outside of the window length, and therefore, in a further development of this embodiment, at least one of the additional slots extends exclusively outside of the window length of the at least one coil/resonator system.

In an alternative embodiment, the additional slots are rotated at least once completely about the z-axis within the window length of the at least one coil/resonator system.

The additional slots are thereby preferably rotated through an integer multiple of a full rotation about the z-axis within the window length of the at least one RF coil/resonator system.

In an advantageous embodiment of the inventive apparatus, the slots outside of the window length of the at least one RF coil/resonator system have a smaller slope than those within the window length, permitting compensation of stronger fields outside the window length.

In one alternative embodiment, the slots outside the window length of the at least one RF coil/resonator system have a higher slope than those within the window length, or extend in an axial direction. This compensates for weaker fields outside of the window length.

It is basically advantageous to adjust the slopes of the slots in such a manner that the coupling between the shielding configuration and the at least one coil/resonator system is minimum.

A further embodiment of an NMR apparatus which also lies within the scope of the invention, is characterized in that the at least one slot of the electrically conducting layer of the shielding configuration extends continuously radially and divides the electrically conducting layer of the shielding configuration into at least two regions, wherein the configuration of the radial slots is mirror-symmetrical with respect to the xy plane, and at least one additional pair of axial slots is provided in at least one central region of the window length, which connect two neighboring radial slots or a radial slot and an end edge of the electrically conducting layer of the shielding configuration, wherein the entire configuration of the slots is point-symmetrical relative to the center of the shielding configuration but not mirror-symmetrical with respect to the xy plane, the shielding configuration being positioned with respect to the coil/resonator system in such a manner that coupling between the at least one coil/resonator system and the shielding configuration is minimized.

Due to the point symmetry of the shielding configuration, the paired regions also have opposite couplings in this case.

One region of the shielding configuration without a slot may be provided in the center of the window length, since only small eddy currents are generated there during decay.

All regions of the shielding configuration preferably have an axial slot in the z-direction. The axial slots of the individual regions are disposed to be point-symmetrical.

In a special embodiment of the invention, all separations between neighboring radial slots are the same. This embodiment is particularly simple to construct, since the recovery currents of the gradients must not be calculated.

In an alternative embodiment, however, the separations between neighboring radial slots in the region of the center of the window length are smaller than outside the window length. This is advantageous, in particular, for configurations having particularly high gradient eddy currents in the center of the window length.

Alternatively, the separations of neighboring radial slots in the region of the center of the window length are larger than outside of the window length L. This reduces the RF loss, since the RF mirror currents may flow on paths without slots respectively across a small number of capacitances.

In all embodiments of the inventive NMR apparatus, the shielding configuration advantageously comprises exactly one electrically conducting layer and capacitive elements which are disposed across the at least one slot in such a manner that unperturbed flow of the RF currents in the region of the measuring frequency is largely ensured.

The shielding configuration may also comprise two electrically conducting layers between which a dielectric, non-conducting layer is disposed, wherein the slots in the two electrically conducting layers do not coincide. Additional capacitive elements can then be omitted.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

BRIEF DESCRIPTION OF THE DRAWING

FIG. 6a shows a plan view of an electrically conducting layer of an inventive shielding configuration with axially slotted outer regions;

FIG. 6b shows a developed view of a section of the electrically conducting layer of the shielding configuration of FIG. 6a;

FIG. 7a shows a plan view of an electrically conducting layer of an inventive shielding configuration with further axial slots in the outer region;

FIG. 7b shows a developed view of a section of the electrically conducting layer of the shielding configuration of FIG. 7a;

FIG. 8a shows a plan view of an electrically conducting layer of an inventive shielding configuration with further spiral slots in the outer region;

FIG. 8b shows a developed view of a section of the electrically conducting layer of the shielding configuration of FIG. 8a;

FIG. 9 shows a plan view of an electrically conducting layer of an inventive shielding configuration with further spiral slots within the window length of the coil/resonator system;

FIG. 10b shows a graphic illustration of the behavior of a slot in an electrically conducting layer of an inventive shielding configuration for the rectangular field profile of FIG. 10a;

FIG. 11b shows a graphic illustration of the trace of a slot of an electrically conducting layer of an inventive shielding configuration for the field profile of FIG. 11a;

FIG. 12b shows a graphic illustration of the trace of a slot of an electrically conducting layer of an inventive shielding configuration for the field profile of FIG. 12a;

FIG. 15a shows a plan and a developed view of an electrically conducting layer of a shielding configuration with point-symmetrical slots comprising several radial slots;

FIG. 15b, c show a plan and a developed view of electrically conducting layers with point-symmetrical slots and a plurality of axial and radial slots;

FIG. 17a graphically illustrates the perpendicular magnetic flux in dependence on z;

FIG. 17b shows a plan and a developed view of an electrically conducting layer of a shielding configuration with point-symmetrical, irregular, radial slots, associated with the flux behavior shown in FIG. 17a;

FIG. 20a graphically shows the perpendicular magnetic flux in dependence on z;

FIG. 20b shows a developed view of a shielding configuration which is slotted radially and in the z-direction, for a magnetic flux according to FIG. 20a in accordance with prior art; and FIG. 21 shows cross-sectional views in the xy plane of a shielding configuration with four slots in the z-direction with the corresponding eigenmodes in accordance with prior art.

DESCRIPTION OF THE PREFERRED EMBODIMENT

Figure 1A:
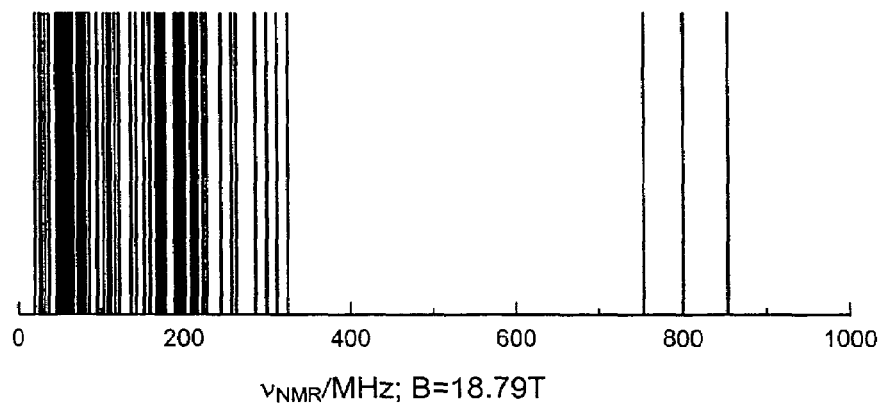
FIG. 1a shows a frequency spectrum of the resonance frequencies of the most important NMR nuclei.

The measuring frequencies of the most important NMR nuclei appear in two "groups" (FIG. 1a).

$^3$H, $^1$H and $^{19}$F have a γ of 25-28 $10^7$ rad/Ts. The next relevant nucleus is $^{31}$p with γ of 10.8 $10^7$ rad/Ts, i.e. 2.5 times lower than the three other nuclei. The further relevant nuclei for NMR fill the spectrum down to γ=0.69 $10^7$ rad/Ts ($^{41}$K). For a proton frequency of 800 MHz, this means e.g. that there is a gap between 324 MHz and 753 MHz without measuring frequencies.

This may basically be used to design a shielding configuration to have no eigenresonance in the vicinity of one nucleus (or more of the three nuclei) with high gamma and geometrically decouple the nuclei with low resonance frequencies. Towards this end, only a gap of the spectrum of the shielding configuration must be positioned between the elements through adjustment of the capacitive couplings, such that the eigenmodes are below and above the group of high frequencies.

Figure 1B:
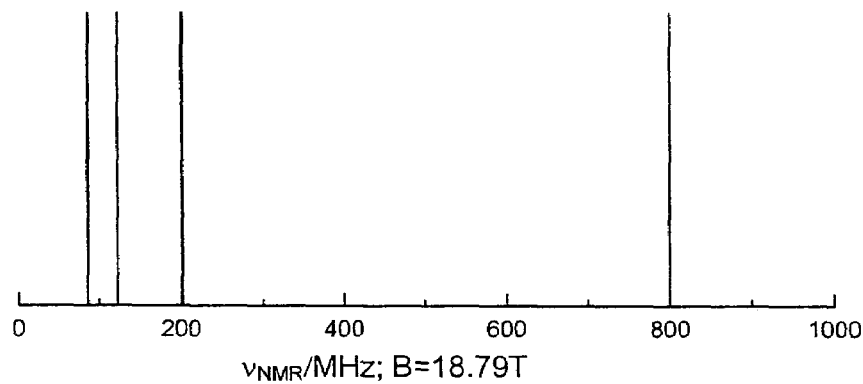
FIG. 1b shows a frequency spectrum of the measuring frequencies of a typical NMR probe head ($^{15}$N, $^{2}$H, $^{13}$C, $^{1}$H) at B=18.79T.
Figure 1C:
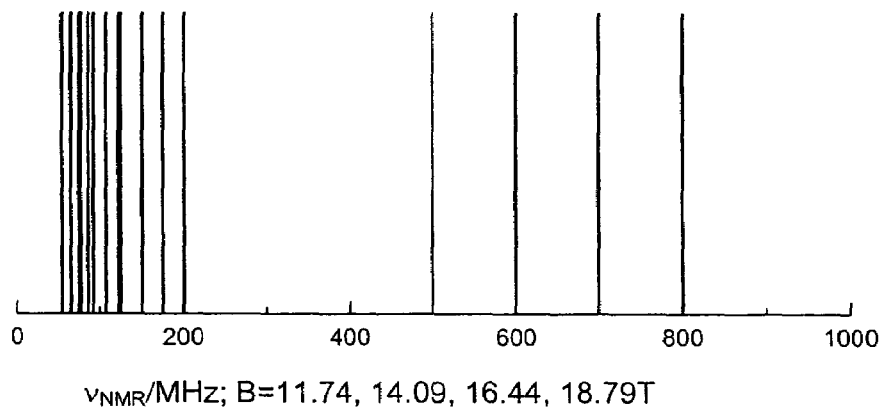
FIG. 1c shows a frequency spectrum of the same probe head with resonance frequencies for $^{15}$N, $^{2}$H, $^{13}$C, and $^{1}$H at B=11.74, 14.09, 15.44, and 18.79T.

In practice, most probeheads have only one set of tunable resonance frequencies. A typical NMR probe head contains the following measuring frequencies: $^{15}$N, $^2$H, $^{13}$C, $^1$H. Its spectrum (at 18.79 T) is shown in FIG. 1b.

Considering probeheads for different magnetic field strengths with 1H resonance frequencies in a range from 500 to 800 MHz, which are common for radio frequency spectroscopy, there remains a large gap in the spectrum. For this reason, a shielding configuration can be designed which can be universally used for all common measuring frequencies.

The embodiments of the inventive shielding configuration shown in FIGS. 2 through 9 refer to an idealized rectangular HF-field distribution. In case of a more realistic field profile, the slope and periodicity of the slots may deviate from those shown in the special embodiments described below.

Figure 2:
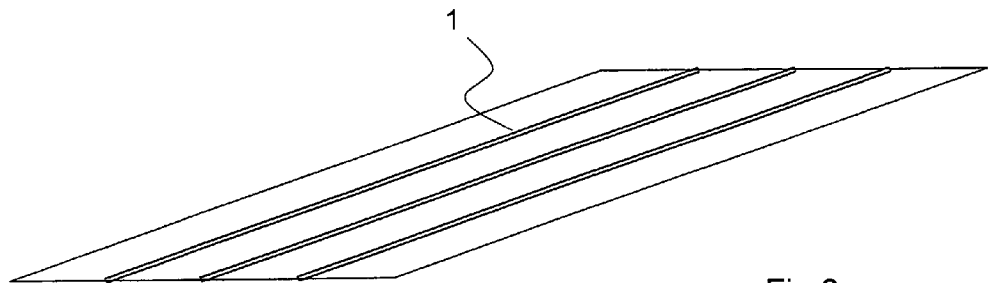
FIG. 2 shows a developed view of a slotted, electrically conducting layer of an inventive shielding configuration.

In order to obtain geometric decoupling for the lower frequencies, one embodiment of the inventive shielding configuration comprises slots 1 (i=1, 2, 3, 4, . . . ) that completely interrupt the electrically conducting layer of the shielding configuration in a direction having a z component different from 0. FIG. 2 shows a developed view of an inventive slotted shielding configuration with four slots. These slots 1 are capacitively closed (via overlap or discrete capacitors, described below) such that the lowest eigenresonance of the shielding configuration may be considerably lower than all NMR nuclei but also between two arbitrary frequencies.

Figure 3A:
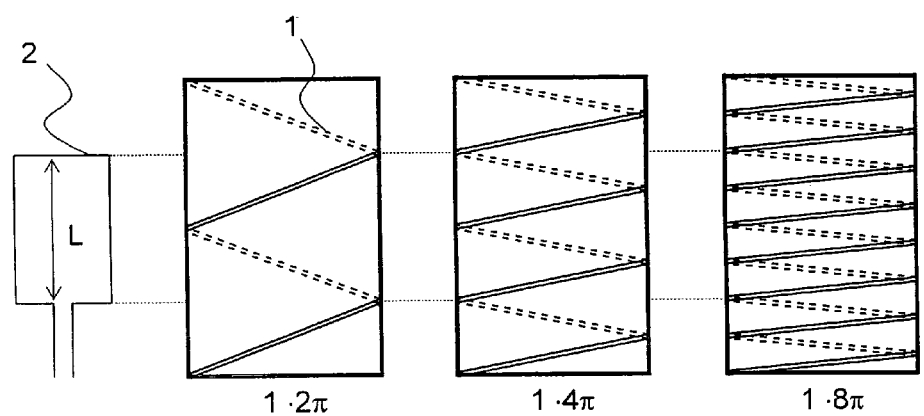
FIG. 3a shows plan views of inventive electrically conducting layers with a spiral slot of a periodicity $2\pi$, $4\pi$, $8\pi$.
Figure 3B:
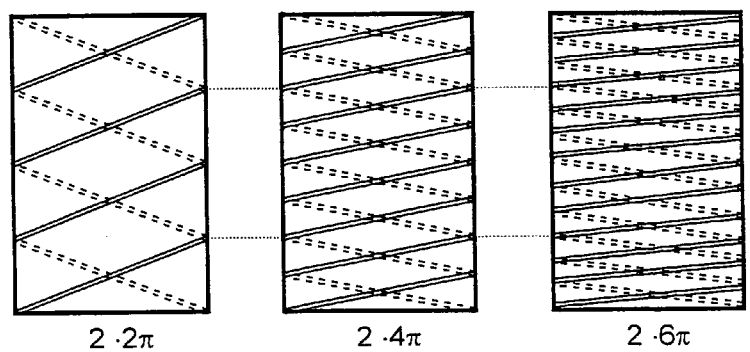
FIG. 3b shows plan views of inventive electrically conducting layers with two spiral slots of a periodicity $2\pi$, $4\pi$, $6\pi$.
Figure 3C:
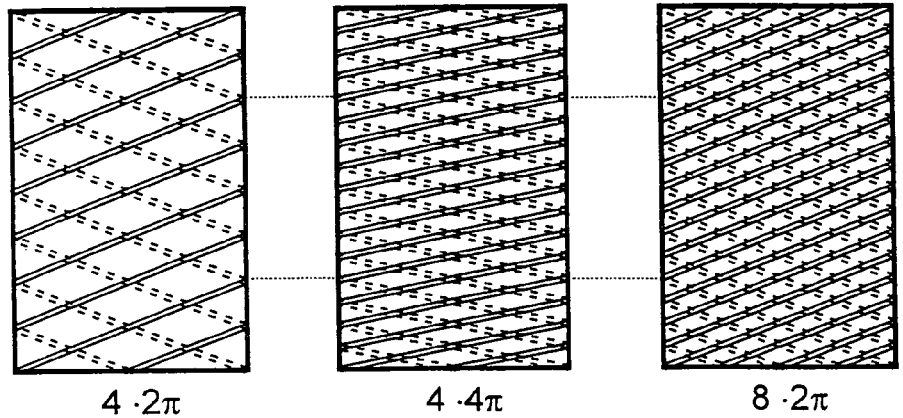
FIG. 3c shows plan views of inventive electrically conducting layers with four or eight spiral slots of a periodicity $2\pi$, $4\pi$.

FIGS. 3a through c show examples of a shielding configuration for a coil/resonator system 2, wherein the shielding configuration comprises a different number of slots 1 with different periodicities. A common feature of the embodiments shown is that the slots 1 are disposed with n*2π periodicity over the approximate window length L of the coil/resonator system 2. The dimensions of the shielding configuration are selected such that the axial extent of the shielding configuration projects beyond the window length L of the coil/resonator system 2.

Figure 4:
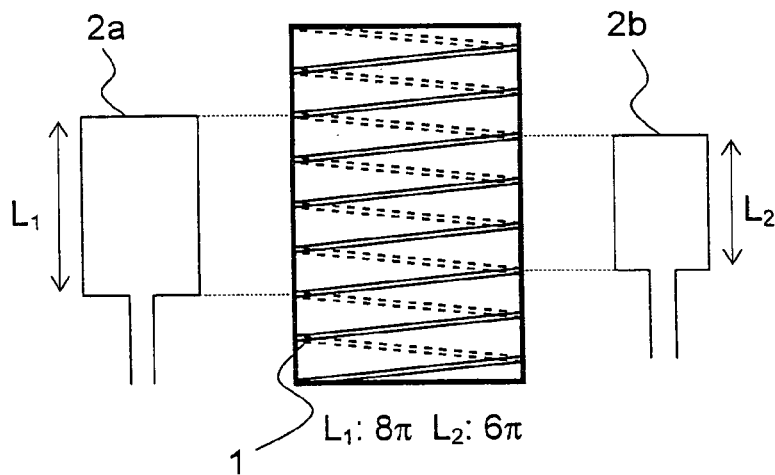
FIG. 4 shows a plan view of an electrically conducting layer of an inventive shielding configuration with a spiral slot for an NMR apparatus with two coil/resonator systems.

FIG. 4 shows a shielding configuration for an NMR apparatus with two coil/resonator systems 2a, 2b. Advantageously, more than only one 2π periodicity of the slots 1 is present. Particularly advantageous is a periodicity (smallest common denominator) over the window lengths $L_1$, $L_2$ of all coil/resonator systems 2a, 2b, since in this case, all coil/resonator systems 2a, 2b have negligible couplings.

Figure 5:
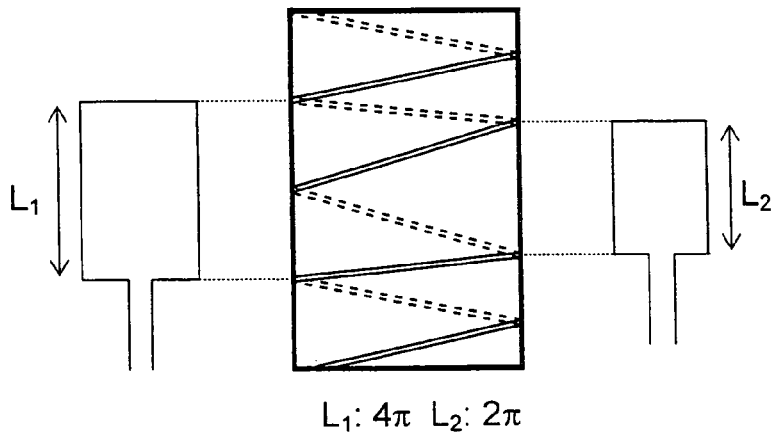
FIG. 5 shows a plan view of an electrically conducting layer of an inventive shielding configuration with a spiral slot with variable slope for an NMR apparatus with two coil/resonator systems.

It is, however, not necessary to keep the same slope over the entire shielding. For this reason e.g. rotation through $L_2$n*2π is also possible and then again m*2π through $L_1$-$L_2$. The outer region may have any design. FIG. 5 shows such an embodiment of the shielding device having a periodicity of 4π within the window length $L_1$ and a periodicity of 2π within the window length $L_2$.

In order to minimize the coupling between the coil/resonator system 2 and the shielding configuration, the strict periodicity of the slots 1 may be omitted and instead the slope of the field amplitude of the coil/resonator system 2 to be decoupled from the shielding device may be adjusted. The strict periodicity of the slots 1 is based on a rectangular field amplitude distribution of the coil/resonator system 2 that is, of course, not the case in reality. The weaker (or even stronger) fields in the edge region of the window length L can be compensated for through local increase (or reduction) of the slope of the slots 1. This is also reasonable, in particular, in the outer region (or above and below the window length L), where the field considerably drops and a 2π periodicity of the slots 1 yields insufficient decoupling.

This statement makes clear that the "periodicity" of the shielding device must only be given in the region of large field amplitudes of the coil/resonator systems. A conventional design, i.e. with axial slot sections 4 (without rotation) may also be used in the outer region. FIG. 6a shows such an embodiment of the electrically conducting layer. FIG. 6b shows a developed view of a section 3 of the electrically conducting layer of this shielding configuration.

If the amplitude of the eddy currents during gradient switching is higher outside of the window length L than within the window length L, it may be helpful to further divide the shielding device outside of the window length L by further slots 5 (FIGS. 7a, 7b). This applies for the shielding configuration with continuous periodic slots 1 as well as for those with axial slot sections 4 in the outer region. The maximum length of the further slots 5 is thereby only given by way of example. The shielding device may be only slotted in a shorter region. Even if the eddy currents are maximum in the window region during gradient switching, it may be reasonable to still introduce further slots in the edge region, since each slot in the active region produces a certain, yet small loss. In order to optimize the RF properties, it may be necessary to provide fewer slots in the central region than in the outer region.

FIGS. 8a, 8b show plan views of an electrically conducting layer of an inventive shielding configuration and a developed view of a section 3 of the electrically conducting layer with wider spiral slots 5 outside the window length L.

If the periodicity of the slots 2 is larger than $2\pi$ through the window length L, part of the shielding configuration in the region of the window length L may be further slotted using the additional slots 5, if, in total, each additional slot 5 also rotates through $2\pi$ within the window length L. The additional slots 5 may thereby each be rotated e.g. on the lower and upper edges each by e.g. $\pi$ (FIG. 9).

The structure of the above-presented electrically conducting layers is very similar to the structure of the "multiply tuned resonant structure" of [11] and [12], however, with the following differences:

1. A shielding configuration is not a "resonant coil structure", since it does not generate a field outside of the shielding configuration during operation, but delimits the field generated by the coil/resonator systems to the inner space.
2. The shielding configuration is not supposed to oscillate during operation of the NMR apparatus, to ensure limitation of the field to the inner space of the shielding configuration, i.e. it is not supposed to emit at a measuring frequency.
3. The shielding configuration of a high-resolution NMR apparatus is also disposed at a large distance from the sample and has sufficient length that it need not consist of a susceptibility-compensated material as is common in conventional coil systems.
4. The shielding configuration must not have two closed conductor rings at the top and bottom. These would be disadvantageous, since they would produce a continuous path for eddy currents during switching of the gradients.

It is therefore clear, that, despite the initially apparent similarities, the inventive configuration actually concerns a completely different structure.

If a twisted coil in accordance with [11] or [12] is used as coil/resonator system 2, the inventive shielding configuration should either be oriented opposite to the direction of rotation of this coil, or if the direction of rotation is the same, it should rotate through at least $2\pi$ more than the twisted coil.

The smaller the number of slots 1, 5 used in the shielding device, the simpler is the spectrum of the shielding configuration. If the decay rate for the eddy currents during switching of the gradient system is the same, the number of rotations must be increased if there are less slots 1, 5. This reduces the frequencies of the eigenresonances of the shielding configuration. However, these do not appear in "packages" such as "birdcage-modes" but individually. This facilitates adjustment to several measuring frequencies.

If only one single slot 1 is introduced into the shielding configuration, the fundamental mode and also the excited modes have only minor fields in the xy plane, and the majority of the field is oriented in the z-direction. This considerably reduces coupling between the coil/resonator system 2 and the shielding configuration. Residual xy fields are produced, since the field amplitudes are maximum in the region of the shielding configuration opposite to the slot 1. This is due to the fact that the shielding configuration is operated either in the region of its excited modes and/or the wavelengths in the region of the measuring frequencies are not considerably larger than the dimensions of the shielding configuration. This involves mainly standing waves on the shielding configuration, which produce non-constant currents. This region is rotated about the z-axis due to the spiral arrangement of the slot 1 in the inventive shielding configuration, thereby also producing components in the xy direction. The coupling is globally minimized by appropriate rotation.

One single axial slot 1 is generally insufficient to guarantee unperturbed penetration of the gradient fields. Rotation of the slot 1 about the z-axis increases the resistance for the eddy currents thereby reducing the time constant. It must, however, also be observed that there is a residual coupling with the single-slotted shielding configuration, since the fields of the different modes of this shielding configuration are not homogeneous in the xy plane.

Radial subdivisions may, of course, also be introduced to positively influence the decay times of the eddy currents. This is particularly advantageous when each generated section still rotates through at least $2\pi$ within the window length, but also when the capacitances between these sections are large enough to be electrically (capacitively) connected for the eigenmodes in the region of the measuring frequencies. These additional radial subdivisions are particularly useful for a z gradient when they intersect the shielding configuration in the symmetry plane of the gradient, since the shielding currents on the upper and lower half planes flow in opposite directions. In particular, when the sections of the shielding configuration rotate in the z-direction at least through $2\pi$ within the window length L, the additional slots 4 along the z-direction must no longer be continuous over the entire z-direction.

The direction of rotation of the slots 1 must not be the same. The slots 1 of the shielding configuration may rotate through the window length L e.g. in total through $2\pi$ towards the right and others through $2\pi$ towards the left.

Figure 10A:
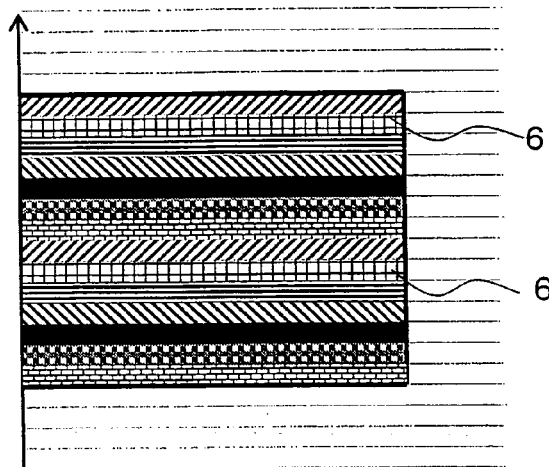
FIG. 10a shows a rectangular field profile of an ideal coil/resonator system, which schematically shows regions of an inventive shielding configuration with opposite couplings.
Figure 10B:
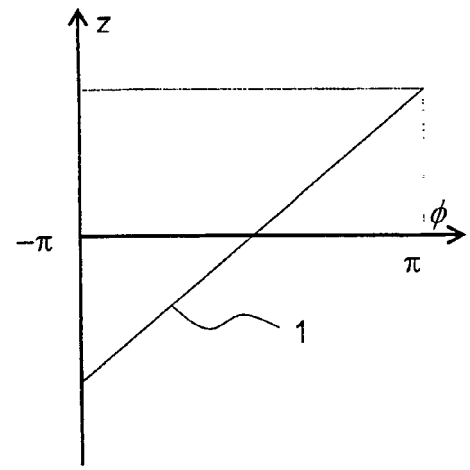

Moreover, the periodicity need not be exactly $2\pi$ through the window length L. This rule applies only for a rectangular field profile. FIG. 10a shows such a rectangular field profile in the z-direction (parallel to the static magnetic field) of a (theoretically) ideal coil/resonator system 2 whose z position of a slot 1 is graphically shown in FIG. 10b in dependence on the angle of rotation $\Phi$.

In the field profile of FIG. 10a, the z-direction is divided into equidistant regions 6. If the slot 1 is rotated through $2\pi$ through the length of the field, there is always a pair of regions 6 (marked by identical hatching) having exactly opposite couplings, since they always have a mutual geometric offset of $\pi$.

This applies when the modes of the shielding configuration have a quasi-constant current over the window length L of the coil/resonator system 2. This condition is met when either the capacitive couplings of the sections of the electrically conducting layer of the shielding configuration are large enough or when the shielding configuration is long enough to provide a sufficiently constant current on the shielding configuration in the field region of the coil/resonator system 2.

Figure 11A:
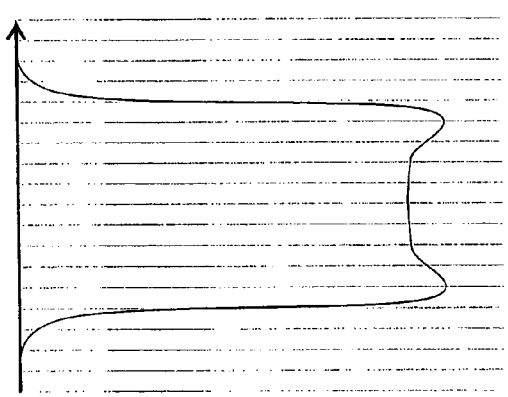
FIG. 11a shows a realistic field profile.
Figure 11B:
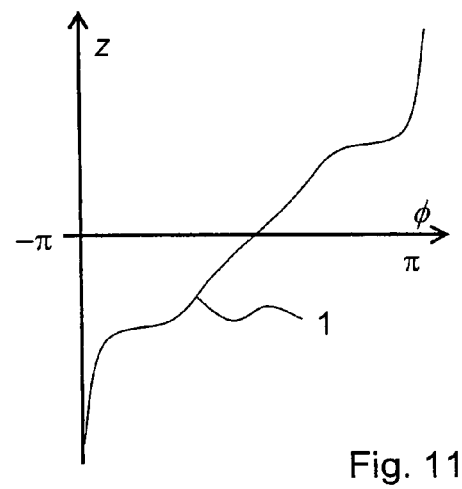
Figure 12A:
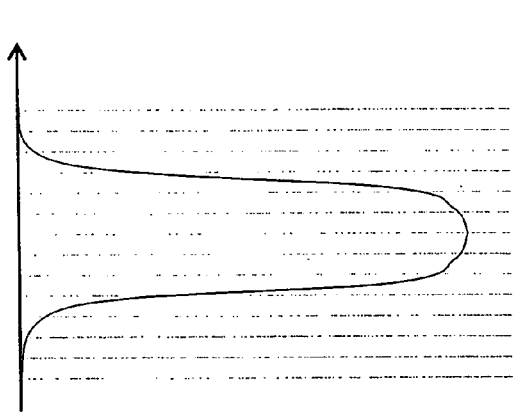
FIG. 12a shows a further realistic field profile.
Figure 12B:
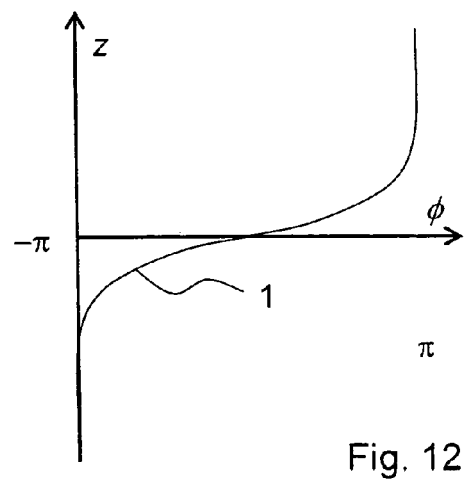

A realistic coil/resonator system 2 has flat sides and either "camel humps" (FIG. 11a) or a "bulge" (FIG. 12a), depending on the length. In this case, the slope of the rotating slots 1 of the inner shielding may be varied in order to reduce the coupling (FIGS. 11b, 12b). The same also applies if compensation to a higher mode (with i nodes) of the shielding configuration is desired and not to the basic mode.

The inventive shielding configuration is particularly advantageous in that it is fully compatible with quadrature coils, since it has no preferential direction.

If the slope of the slots 1 of the shielding configuration becomes more and more flat (=periodicity n*2π with n approximating an infinite value), precise adherence to the periodicity over the window length L becomes less important. In the limiting case, the slots 1 rotate in the peripheral direction of the shielding configuration, such that the modes are always perpendicular irrespective of the periodicity, and are therefore decoupled. Residual couplings are averaged out due to the high number of rotations. However, it is very difficult in this case to ensure sufficient capacitance for shielding the RF fields. This limits the number of rotations. For a typical NMR probe head with a window length L in a region of 20 mm, a maximum of 4 to 5 revolutions is reasonable. Experiments have shown that the residual couplings are sufficiently small even with a small number of rotations (2π-8π), such that absolute elimination of the couplings is not necessary. In this case, the exact "periodicity" need not be kept.

The function of the above-described embodiments of the inventive shielding configuration is to minimize the integral coupling above z using a "2π periodicity".

Figure 13:
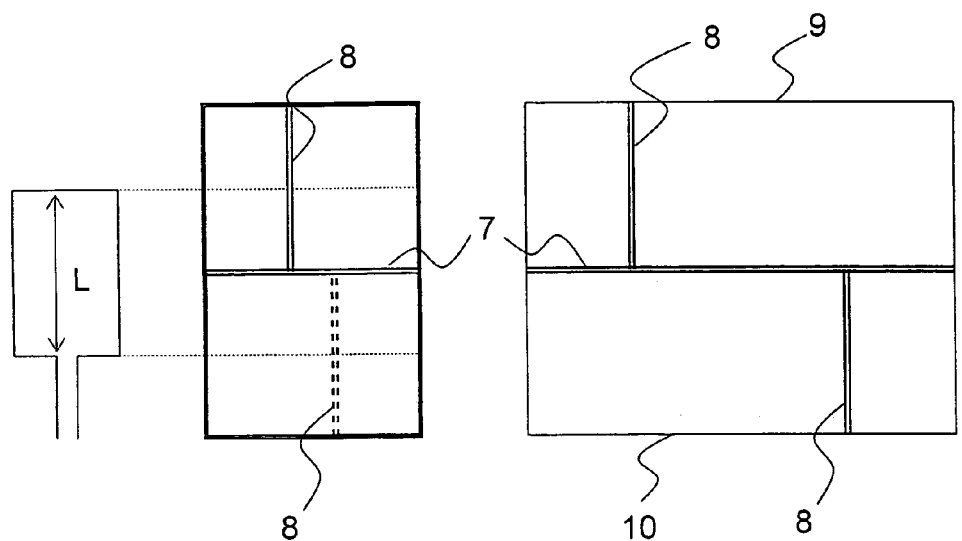
FIG. 13 shows a plan view and a developed view of an electrically conducting layer of an inventive shielding configuration with point-symmetrical slots.

In an alternative embodiment of the inventive shielding configuration (second embodiment) this periodicity "collapses" in one point. This alternative embodiment comprises at least three slots 7, 8, at least one radial slot 7 and one slot 8 extending axially from each radial slot 7, which extends to the upper 9 or lower end edge 10 of the shielding configuration, wherein the two axial slots 8 are rotated through 180° relative to each other (FIG. 13).

Figure 14:
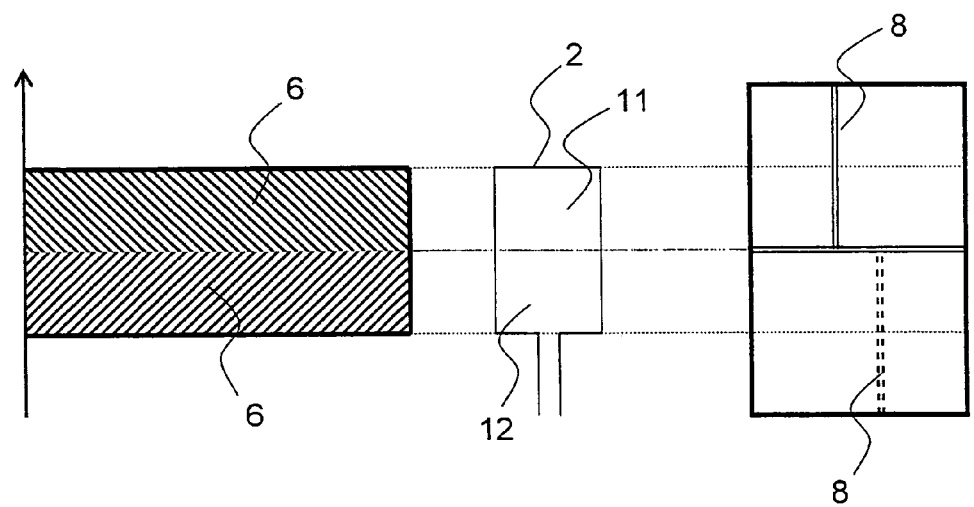
FIG. 14 shows a mirror-symmetrical field behavior of the coil/resonator system and a plan view of an electrically conducting layer of a shielding configuration with point-symmetrical slots.

Point symmetry is introduced, such that a pair of regions 6 again have opposite couplings (FIG. 14). This is due to the fact that an ideal coil/resonator system has magnetic symmetry in the xy plane (for non-ideal coil/resonator systems 2 this symmetry is not completely, but largely met). The only requirement for this is that the axially upper part 11 of the shielding configuration is rotated through π relative to the lower part 12, i.e. there is point symmetry about the center of the coil/resonator system 2. This point symmetry contrasts with the mirror symmetry of the coil/resonator system 2 and eliminates the coupling between the coil/resonator system 2 and the shielding configuration.

The coupling produced between the upper part 11 of the shielding configuration and the coil/resonator system 2 is exactly opposite to that generated in the lower part 12 (thereby neglecting the symmetry interruption through the connecting legs of the coil/resonator system). The coil/resonator system 2 couples to the shielding configuration since one single coil/resonator system 2 with a shielding configuration comprising two axial slots 8 can be orientated in such a manner that all modes of the coil/resonator system 2 and the shielding configuration are perpendicular to each other. If the shielding configuration has only one slot 8 or more than two slots 8 in an axial direction, this orientation is no longer possible, since in this case the shielding configuration interrupts the electric and magnetic symmetry planes of the coil/resonator system 2 (xz and yz plane). The same applies, of course, for a further coil/resonator system 2 being largely oriented perpendicularly to the first.

As is shown in FIGS. 15a, 15b, 15c, it is possible to provide more slots 7, 8. This only requires that the point symmetry be maintained about the center of the shielding configuration. In order to enable positioning of the shielding configuration relative to two coil/resonator systems 2, the magnetic and electric symmetry is also suitably interrupted in the x and y planes of the coil/resonator systems 2, such that the couplings to the two parts 11, 12 of the shielding configuration (above and below the center) are approximately identical for all coil/resonator systems 2. This means that axial slots 8 must be oriented at 45° with respect to the symmetry planes of the two-coil/resonator systems 2 if a system of orthogonal coil/resonator systems 2 must be decoupled. The orientation may therefore be facilitated by inserting an uneven number of slots 7, 8 in each part of the shielding configuration.

Figure 16:
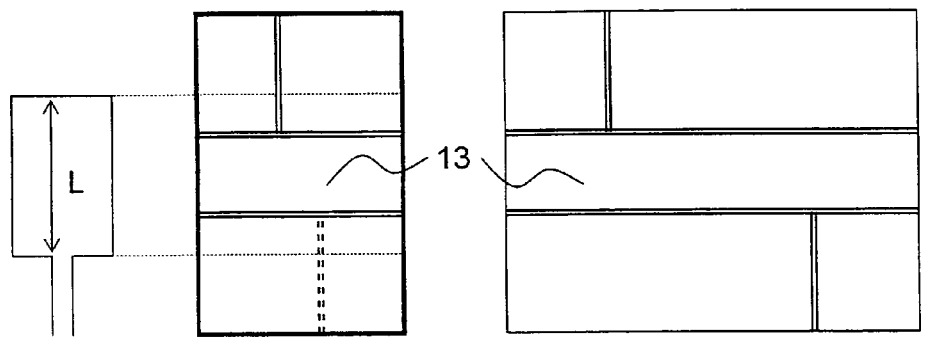
FIG. 16 shows a plan and a developed view of an electrically conducting layer of a shielding configuration with point-symmetrical slots and central regions without slots.

FIG. 16 shows that it is also fundamentally possible to provide no slots in a region 13 in the center of the window length L, since none or only small mirror currents are generated during decay of the gradient for reasons of symmetry.

Figures 17A, 17B:
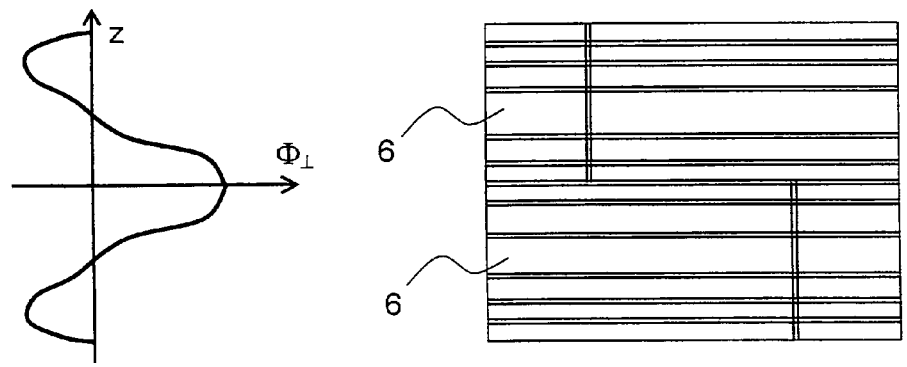

In order to optimize the recovery properties of the shielding configuration, the slots may be provided in the z-direction, such that the flux in a direction perpendicular direction to the shielding configuration, which penetrates through the respective regions 6 in the z-direction, is substantially undisturbed (FIG. 17a). FIG. 17b shows this case for a z gradient.

In both types of shielding configurations, the couplings between the coil/resonator systems 2 and the different modes of the shielding configuration are eliminated; clearly, only for those modes having the interrupted symmetry. The design will generally be such that the lowest mode meets this criterion. On the other hand, the shielding configuration may also be designed in such a manner that higher modes are eliminated. In general, the modes, which have not been optimized, still advantageously have considerably lower couplings than in a conventional shielding configuration with only axial slots. Complete elimination of the coupling is usually not required. Attenuation of 30 to 40 dB is absolutely sufficient as long as the measuring frequencies do not coincide exactly with the eigenmodes of the shielding configuration.

A further feasible embodiment of the inventive shielding configuration represents a mixture of the two above-discussed alternative embodiments (not shown). Each point-symmetrical partial region of the shielding configuration may thereby have one slot 1 which exercises at least one rotation in the z-direction, wherein the entire structure is point-symmetrical. This embodiment minimizes the coupling between each individual section 3 of the shielding configuration and the resonator system 2 and reduces the residual coupling through geometric elimination of two regions 6.

Figures 18A, 18B, 18C, 18D:
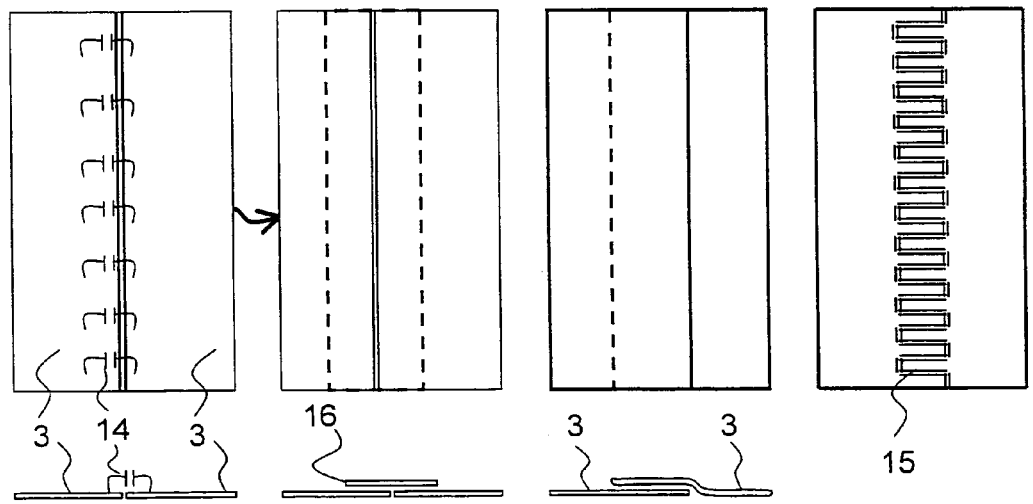
FIG. 18a shows a schematic plan view and a cross-sectional view of two capacitively connected and electrically conducting layers.
FIG. 18b shows a plan view and a cross-sectional view of two electrically conducting layers which are capacitively connected using a further electrically conducting layer and a dielectric.
FIG. 18c shows a plan view and cross-sectional view of two electrically conducting layers which are capacitively connected using overlaps.
FIG. 18d shows a plan view of two electrically conducting layers which are capacitively connected using finger capacitors.
Figure 19A:
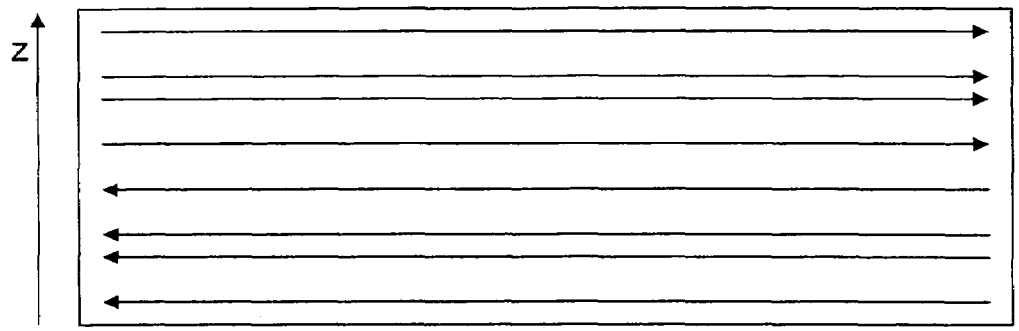
FIG. 19a shows a developed view of an unslotted shielding configuration that schematically shows the current behavior in accordance with prior art.
Figure 19B:
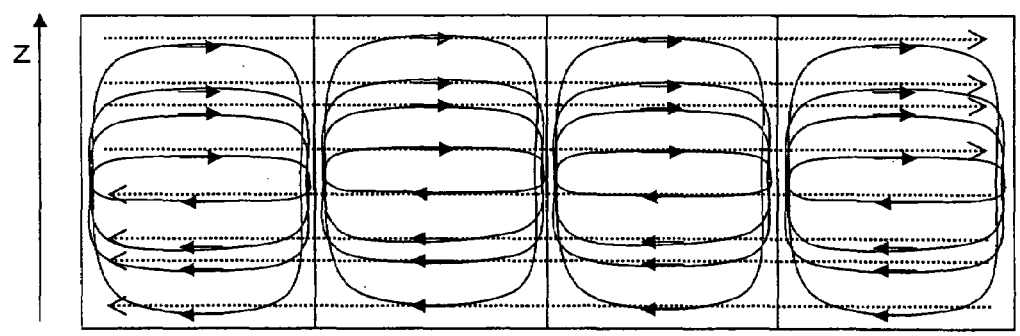
FIG. 19b shows a developed view of a shielding configuration that is slotted in the z-direction, which schematically shows the current behavior in accordance with prior art.
Figure 19C:
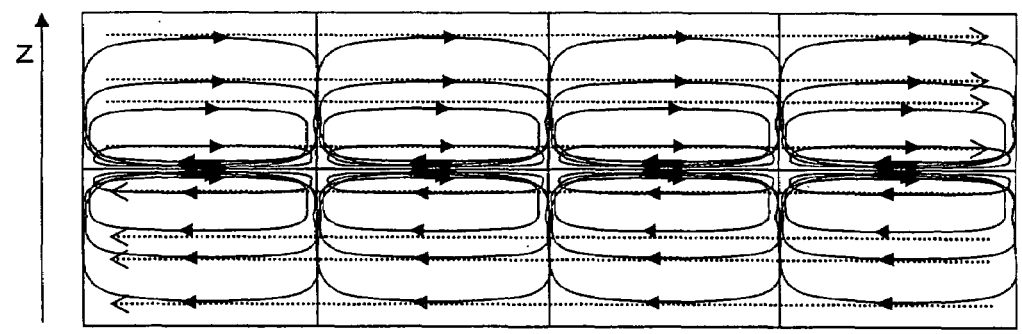
FIG. 19c schematically illustrates the effect of a central radial slit on eddy currents.

In order to minimize the RF loss in the various embodiments of the inventive, non-coupling shielding configuration, a capacitive connection 14 between the individual sections 3 of the electrically conducting layers of the shielding configuration is provided (FIG. 18a). This may be achieved either through discrete conventional capacitors or through distributed capacitances through overlapping the individual sections 3 of the electrically conducting layers (FIGS. 18b, 18c). A combination thereof is also possible. Mounting of the capacitive elements modifies the eigenmode spectrum of the shielding configuration (frequency of the eigenmodes decreases).

In the embodiment of the inventive shielding configuration with slots 1 which completely intersect the electrically conducting layer of the shielding configuration in one direction having a z component other than 0 (first embodiment), the distributed capacitances may be produced through a corresponding structure with opposite direction of rotation or with identical direction of rotation. Moreover, the electrically conducting layers need not have the same periodicity and number of slots 1. Further additional electrically conducting layers may be provided to additionally shield fields that may "leak". In the second embodiment, an equivalent structure of an electrically conducting layer can be shifted by half the height relative to a first electrically conducting layer, wherein the region 13 centered about the center ideally has no slot 1.

The embodiment for distributed capacitances with the simplest production is an embodiment on a laminated sheet that represents a thin dielectric, which is coated on both sides with metal with a thickness of 2-10 skin depths.

The geometrically simplest shape (although more difficult to manufacture) is produced through mounting thin metal foils onto a carrier and insulating them from each other through non-conducting sheet (e.g. made from a fluoropolymer, Kapton or the like) or enamel. A capacitance may thereby be generated through overlaps (FIGS. 18b, 18c).

In a further embodiment, the capacitances are realized between the sections 3 of the electrically conducting layer using finger capacitors 15 along the slots (FIG. 18d).

A dielectric carrier (sapphire tube/polyhedron, also of plastic material, aluminium nitride etc. . . . ) may also be coated with a thin layer having good conducting properties. This layer may be structured towards the shielding configuration. Either discrete capacitive elements may then be installed or a distributed capacitance may be generated. The latter may be performed through coating using a dielectric and further coating using a second, electrically conducting layer 16 or again by structuring finger capacitors. Alternatively, a laminated sheet that is coated on one side may be disposed onto the structured carrier (tensioning, clamping, gluing . . . ) or a dielectric layer and a metal foil are mounted.

LIST OF REFERENCES

[1] U.S. Pat. No. 4,310,799 A1
[2] U.S. Pat. No. 4,506,224 A1
[3] U.S. Pat. No. 4,642,569 A1
[4] U.S. Pat. No. 4,871,969 A1
[5] U.S. Pat. No. 4,879,515 A1
[6] U.S. Pat. No. 5,243,286 A1
[7] U.S. Pat. No. 5,381,093 A1
[8] U.S. Pat. No. 5,572,129 A1
[9] U.S. Pat. No. 5,574,372 A1
[10] U.S. Pat. No. 5,680,046 A1
[11] U.S. Pat. No. 6,420,871 B1
[12] U.S. Pat. No. 2004/189304 A1

LIST OF REFERENCE NUMERALS

L window length of the coil/resonator system
1 slot with portion in z-direction
2 RF coil/resonator system
3 section of the shielding configuration
4 axial slot sections
5 further slot
6 region
7 continuous slot on the perimeter
8 non-continuous axial slots
9 upper end edge of the shielding configuration
10 lower end edge of the shielding configuration
11 upper part of the shielding configuration
12 lower part of the shielding configuration
13 region in the center of the window length L
14 capacitive connection
15 finger capacitor
16 second electrically conducting layer

I claim:

1. A nuclear magnetic resonance apparatus for generating a homogeneous static magnetic field in a z-direction, the apparatus comprising:
at least one coil/resonator system for transmitting and/or receiving radio frequency (RF) signals at at least one measuring frequency;
a gradient system for generating pulsed field gradients in at least one spatial direction; and
a shielding configuration disposed radially between said at least one coil/resonator system and said gradient system, said shielding configuration having at least one electrically conducting layer with at least one slot, said electrically conducting layer being disposed about a center of said shielding configuration to be axially symmetrical with respect to a z-axis, wherein, in an axial section $z1<z<z2$ with $z2-z1>L$, with L being equal to a window length of said coil/resonator system containing at least 90% of the magnetic field energy of said coil/resonator system, said shielding configuration defines at least one pair of regions disposed about the z-axis, said regions having a cylinder envelope shape, with two regions of each pair being defined by two respectively closed limiting lines circulating about the z-axis, wherein two limiting lines of each said region have a mutual axial separation from each other of $$a \le \frac{z2 - z1}{2}$$

and are disposed at planes parallel to a xy plane, wherein two regions of said pair are geometrically positioned to oppositely inductively couple to said at least one coil/resonator system for at least some eigenmodes of said shielding configuration.

2. The NMR apparatus of claim 1, wherein said at least one slot of said electrically conducting layer of said shielding configuration completely intersects said at least one electrically conducting layer in a direction having a z component other than 0, thereby executing at least one full rotation about the z-axis within said window length L of said at least one coil/resonator system.

3. The NMR apparatus of claim 2, wherein a slope of said at least one slot of said electrically conducting layer of said shielding configuration is continuous throughout an entire section $z1<z<z2$ of said shielding configuration.

4. The NMR of claim 2, wherein said at least one slot of said electrically conducting layer of said shielding configuration has an integer multiple of rotations about the z-axis through said window length L of one or all said RF coil/resonator systems.

5. The NMR of claim 2, wherein, in addition to said at least one slot completely intersecting said electrically conducting layer of said shielding configuration, the NMR apparatus comprises at least one further slot which starts at an end edge of said shielding configuration and which does not completely intersect said electrically conducting layer.

6. The NMR of claim 5, wherein at least one of said further slots extends exclusively outside of said window length L of said at least one coil/resonator system.

7. The NMR apparatus of claim 5, wherein said further slots exercise at least one full rotation about the z-axis within said window length L of said at least one coil/resonator system.

8. The NMR of claim 7, wherein said further slots are rotated about the z-axis within said window length L of said at least one RF coil/resonator system by an integer multiple of a full rotation.

9. The NMR of claim 2, wherein slots outside of said window length L of said at least one RF coil/resonator system have a lower slope than within said window length L.

10. The NMR of claim 2, wherein said slots outside of said window length L of said at least one RF coil/resonator system have a higher slope than within said window length L or extend in an axial direction.

11. The NMR of claim 2, wherein slopes of slots are adjusted to obtain minimum coupling between said shielding configuration and said at least one coil/resonator system.

12. The NMR of claim 1, wherein said at least one slot of said electrically conducting layer of said shielding configuration is continuously radial and divides said electrically conducting layer of said shielding configuration into at least two regions, wherein radial slots are arranged mirror-symmetrically with respect to the xy plane, and further comprising at least one additional pair of axial slots defined at least in one central region of said window length L to each connect two neighboring radial slots or a radial slot and an end edge of said electrically conducting layer of said shielding configuration, wherein an entire configuration of slots is point-symmetrical relative to a center of said shielding configuration but not mirror-symmetrical with respect to the xy plane, said shielding configuration being positioned relative to said coil/resonator system in such a manner that coupling between said at least one coil/resonator system and said shielding configuration is minimized.

13. The NMR of claim 12, wherein no slots are provided in a region of said shielding configuration in a center of said window of length L.

14. The NMR of claim 12, wherein each region of said shielding configuration in the z-direction has an axial slot.

15. The NMR of claim 12, wherein separations between neighboring radial slots are equal.

16. The NMR of claim 12, wherein separations between neighboring radial slots in a region of a center of said window of length L are smaller than outside of said window of length L.

17. The NMR of claim 12, wherein separations of neighboring radial slots in a region of a center of said window of length L are larger than outside of said window of length L.

18. The NMR of claim 1, wherein said shielding configuration comprises exactly one electrically conducting layer and further comprising capacitive elements which are disposed over said at least one slot such that RF currents in a region of the measuring frequency can flow largely unperturbed.

19. The NMR of claim 1, wherein said shielding configuration comprises two electrically conducting layers between which a dielectric, non-conducting layer is disposed, wherein slots in said two electrically conducting layers do not coincide.

* * * * *